US012567456B2

(12) United States Patent
Park et al.

(10) Patent No.: US 12,567,456 B2
(45) Date of Patent: Mar. 3, 2026

(54) SEMICONDUCTOR MEMORY WITH DUAL QUADRATURE CORRECTED DUTY CYCLE CLOCK OUTPUTS

(71) Applicant: Samsung Electronics Co., Ltd., Suwon-si (KR)

(72) Inventors: Jun Young Park, Suwon-si (KR); Joo Hwan Kim, Suwon-si (KR); Jin Do Byun, Suwon-si (KR); Eun Seok Shin, Suwon-si (KR); Hyun Sub Rie, Suwon-si (KR); Hyun-Yoon Cho, Suwon-si (KR); Jung Hwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 232 days.

(21) Appl. No.: 18/307,098

(22) Filed: Apr. 26, 2023

(65) Prior Publication Data

US 2023/0360689 A1    Nov. 9, 2023

(30) Foreign Application Priority Data

May 4, 2022    (KR) ........................ 10-2022-0055437
Jul. 21, 2022    (KR) ........................ 10-2022-0090261

(51) Int. Cl.
*G11C 11/4076*    (2006.01)
*G11C 7/10*    (2006.01)
(Continued)

(52) U.S. Cl.
CPC ........ *G11C 11/4076* (2013.01); *G11C 7/1066* (2013.01); *G11C 7/222* (2013.01);
(Continued)

(58) Field of Classification Search
CPC ... G11C 11/4076; G11C 7/1066; G11C 7/222; G11C 11/4093; H03K 3/017; H03K 5/05;
(Continued)

(56) References Cited

U.S. PATENT DOCUMENTS 8,072,253 B2    12/2011    Kaeriyama et al.
8,797,076 B2    8/2014    Kibune
(Continued)

*Primary Examiner* — Donald HB Braswell
(74) *Attorney, Agent, or Firm* — Wolf, Greenfield & Sacks, P.C.

(57) ABSTRACT

A semiconductor memory device is provided. The semiconductor includes a data clock buffer that receives a data clock signal from a memory controller and outputs a pair of differential input signals, an edge delay controller that adjusts duty ratios of the pair of differential input signals based on a control code and outputs a pair of corrected clock signals, a first unit delay path circuit that generates four output clock signals having different phases based on the pair of corrected clock signals, a rising edge multiplexer that serially outputs data corresponding to a rising edge of each of the four output clock signals, a second unit delay path circuit that generates four duplicate clock signals having different phases based on the pair of corrected clock signals and a quadrature error correction circuit detector that detects a duty error based on the duplicate clock signals and outputs the control code.

19 Claims, 13 Drawing Sheets

(51) Int. Cl.

| | |
|---|---|
| *G11C 7/22* | (2006.01) |
| *H01L 25/18* | (2023.01) |
| *H03K 3/017* | (2006.01) |
| *H03K 5/05* | (2006.01) |
| *H03K 5/133* | (2014.01) |
| *H03K 5/135* | (2006.01) |
| *H03K 5/156* | (2006.01) |
| *H03L 7/081* | (2006.01) |

(52) U.S. Cl.
CPC .............. *H03K 3/017* (2013.01); *H03K 5/05* (2013.01); *H03K 5/133* (2013.01); *H03K 5/135* (2013.01); *H03K 5/1565* (2013.01); *H03L 7/0812* (2013.01); *H01L 25/18* (2013.01)

(58) Field of Classification Search
CPC ...... H03K 5/133; H03K 5/135; H03K 5/1565; H03L 7/0812; H01L 25/18; H01L 23/49816; H01L 23/5385; H01L 25/0652; H01L 2224/81; H01L 2225/06513; H01L 2225/06517; H01L 2225/06541
See application file for complete search history.

(56) References Cited

U.S. PATENT DOCUMENTS

| | | | | |
|---|---|---|---|---|
| 9,148,136 | B2 | 9/2015 | Seo | |
| 9,543,960 | B1 | 1/2017 | He et al. | |
| 10,348,316 | B2 | 7/2019 | Matsuda | |
| 2014/0010336 | A1 | 1/2014 | Suzuki | |
| 2020/0293080 | A1 * | 9/2020 | Poon | H03K 5/1565 |
| 2020/0312399 | A1 * | 10/2020 | Brox | H03K 3/017 |
| 2021/0265989 | A1 | 8/2021 | Ashtiani et al. | |
| 2022/0094339 | A1 * | 3/2022 | Kim | H03L 7/0816 |
| 2023/0268908 | A1 * | 8/2023 | Qi | H03K 3/017 |
| | | | | 327/175 |

* cited by examiner

320

40%~60%

① QEC_IN
(Don't care)

(50+α) %

② QEC_OUT (50+α) %

③ TSAC_OUT (a)                                                                    (b)

500

<u>1010</u>

SEMICONDUCTOR MEMORY WITH DUAL QUADRATURE CORRECTED DUTY CYCLE CLOCK OUTPUTS

CROSS-REFERENCE TO RELATED APPLICATION

This application claims priority from Korean Patent Application No. 10-2022-0055437 filed on May 4, 2022 and Korean Patent Application No. 10-2022-0090261 filed on Jul. 21, 2022 in the Korean Intellectual Property Office, and all the benefits accruing therefrom under 35 U.S.C. 119, the contents of which in its entirety are herein incorporated by reference.

BACKGROUND

The present disclosure relates to a semiconductor memory device and a memory system.

Semiconductor memory devices may be largely divided into volatile memory devices and nonvolatile memory devices. The volatile memory devices are memory devices in which stored data disappears when the supply of power is interrupted. Among the volatile memory devices, dynamic random access memories (DRAMs) have been used in various fields such as mobile systems, servers, and graphic devices.

As an operation speed of a system including semiconductor devices increases and technologies for integrated circuits develop, the semiconductor memory devices have been required to output or store data at a higher speed. Accordingly, in order to input/output data at a high speed, a synchronous memory device capable of inputting/outputting data in synchronization with a received system clock has been developed. However, it is not sufficient to satisfy a required data input/output speed even with the synchronous memory device, and accordingly, a double data rate (DDR) synchronous memory device in which data are input/output at a rising edge and a falling edge of the system clock and a quad data rate (QDR) memory device capable of transferring four data during one period of the system clock have been proposed. The QDR memory device uses two clocks. The DDR memory device or the QDR memory device may operate in synchronization with a clock applied from the outside. When the clock applied from the outside is used inside the memory device, a time delay (clock skew) and a duty error may occur due to internal circuits. When clock skew and duty error occur, a setup margin or a hold margin for an entire operation of the semiconductor memory device may not be sufficient, such that a malfunction may occur or operations may not be completely performed within a predetermined time.

A circuit for compensating for such a time delay and correcting such a duty error may be used in the semiconductor memory device.

SUMMARY

Aspects of the present disclosure provide a semiconductor memory device with improved operation performance.

Aspects of the present disclosure also provide a semiconductor memory device capable of accurately correcting a phase difference of a multi-phase signal to a target value.

Aspects of the present disclosure also provide a semiconductor memory device and a memory system capable of detecting a duty cycle of an internal clock and correcting a clock skew One aspect of the present disclosure provides a semiconductor memory device including a data clock buffer configured to receive a data clock signal from a memory controller and output a pair of differential input signals, an edge delay controller configured to adjust duty ratios of the pair of differential input signals based on a control code and output a pair of corrected clock signals, a first unit delay path circuit configured to generate four output clock signals having different phases based on the pair of corrected clock signals, a rising edge multiplexer configured to serially output data corresponding to a rising edge of each of the four output clock signals, a second unit delay path circuit configured to generate four duplicate clock signals having different phases based on the pair of corrected clock signals and a quadrature error correction circuit detector configured to detect a duty error based on the duplicate clock signals and output the control code corresponding to the detected duty error.

One aspect of the present disclosure provides a memory system that includes a memory controller configured to transmit a data clock signal and transmit and receive a serial data signal and a semiconductor memory device configured to output data stored in a memory cell array as the serial data signal in synchronization with a rising edge of each of a plurality of output clock signals having different phases. The semiconductor memory device includes a data clock buffer configured to receive the data clock signal and generate a pair of differential input signals having two phases, a quadrature error correction circuit (QEC) configured to adjust duty cycles of the pair of differential input signals according to a control code and output a pair of corrected clock signals, a first unit delay path circuit configured to generate the pair of corrected clock signals as the plurality of output clock signals and a QEC detector configured to detect duty errors of the pair of differential input signals based on the pair of corrected clock signals and generate the control code.

One aspect of the present disclosure provides a semiconductor memory device including a data clock buffer configured to receive a data clock signal from a memory controller and output a pair of differential input signals, an output path configured to adjust duty ratios of the pair of differential input signals based on a control code to generate a pair of corrected clock signals and generate four output clock signals having different phases based on the pair of corrected clock signals, a rising edge multiplexer configured to serially output data input in parallel based on a rising edge of each of the four output clock signals and a feedback path configured to generate four duplicate clock signals having different phases based on the pair of corrected clock signals, detect a duty error from the duplicate clock signals, and output the control code corresponding to the detected duty error.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Hereinafter, a semiconductor memory device according to some embodiments of the present disclosure will be described with reference to FIGS. 1 to 8.

Figure 1:
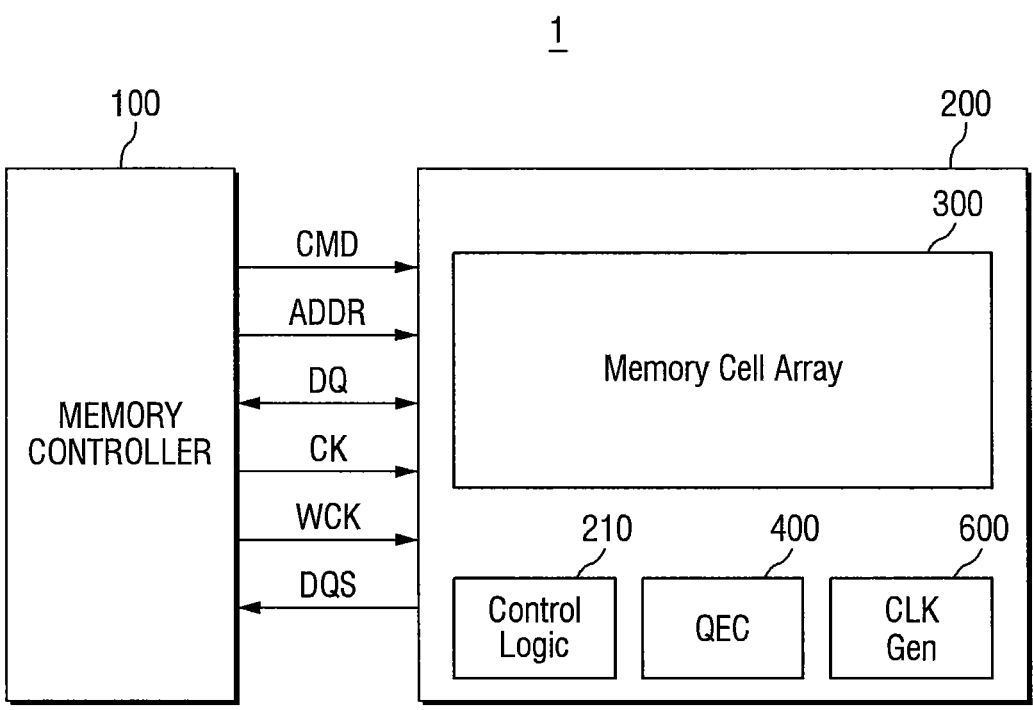
FIG. 1 is a block diagram illustrating a memory system according to some embodiments of the present disclosure.

FIG. 1 is a block diagram illustrating a memory system according to some embodiments of the present disclosure.

Referring to FIG. 1, a memory system 1 may include a memory controller 100 and a semiconductor memory device 200.

The memory controller 100 controls overall operation of the memory system 1, and controls overall data exchange between an external host and the semiconductor memory device 200. For example, the memory controller 100 writes data or reads data by controlling the semiconductor memory device 200 according to a request of a host.

In addition, the memory controller 100 controls an operation of the semiconductor memory device 200 by applying operation commands for controlling the semiconductor memory device 200 to the semiconductor memory device 200. According to some embodiments, the semiconductor memory device 200 may be a dynamic random access memory (DRAM), a double data rate 4 (DDR4) synchronous DRAM (SDRAM), a low power DDR4 (LPDDR4) SDRAM, or a LPDDR5 SDRAM including volatile memory cells.

The memory controller 100 may transmit a clock signal (or a command clock signal) CK, a command CMD, and an address ADDR to the semiconductor memory device 200. When the memory controller 100 writes a data signal DQ to the semiconductor memory device 200 or reads a data signal DQ from the semiconductor memory device 200, the memory controller 100 may provide a data clock signal WCK to the semiconductor memory device 200. When the semiconductor memory device 200 transmits the data signal DQ to the memory controller 100, the semiconductor memory device 200 may provide a strobe signal DQS together with the data signal DQ to the memory controller 100.

The semiconductor memory device 200 may include a memory cell array 300 in which the data signal DQ is stored, a control logic circuit 210, a quadrature error correction circuit (QEC) 400, and a clock generation circuit (CLK Gen) 600.

The control logic circuit 210 may control an operation of the semiconductor memory device 200. The QEC 400 may simultaneously adjust a skew between and duty errors of input clock signals QEC IN generated based on the data clock signal WCK and having a phase difference of 90° therebetween to generate corrected clock signals QEC_OUT having a phase difference of 90° therebetween. The clock generation circuit 600 may generate an output clock signal and the strobe signal DQS based on the corrected clock signals QEC_OUT.

Figure 2:
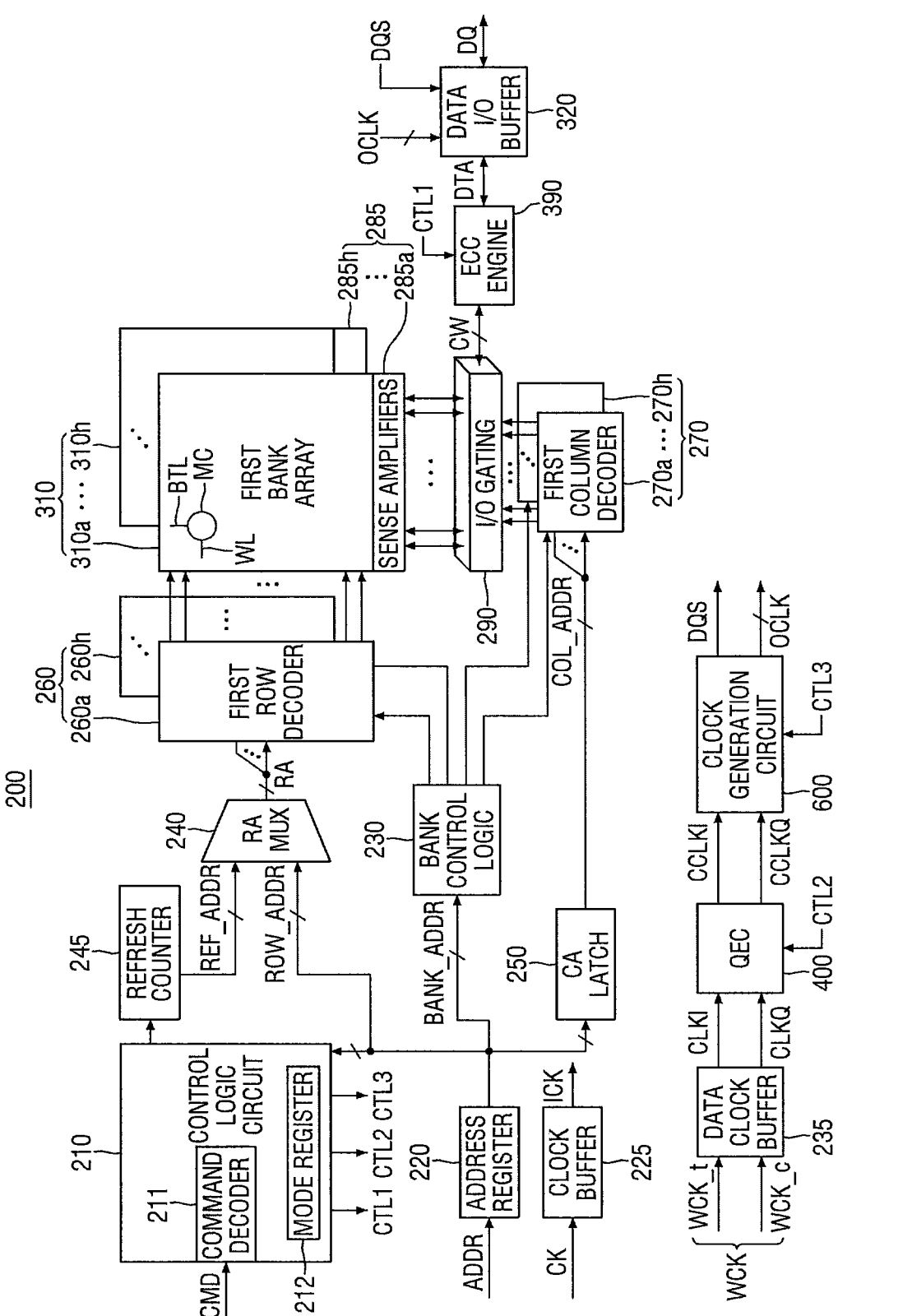
FIG. 2 is a block diagram illustrating a configuration of a semiconductor memory device in the memory system of FIG. 1 according to some embodiments of the present disclosure.

FIG. 2 is a block diagram illustrating a configuration of a semiconductor memory device in the memory system of FIG. 1 according to some embodiments of the present disclosure.

Referring to FIG. 2, the semiconductor memory device 200 may include the control logic circuit 210, an address register 220, a bank control logic 230, a refresh counter 245, a row address multiplexer 240, a column address latch 250, a row decoder 260, a column decoder 270, a memory cell array 310, a sense amplifier unit 285, an input/output gating circuit 290, an error correction code (ECC) engine 390, a clock buffer 225, a data clock buffer 235, the QEC 400, the clock generation circuit 600, and a data input/output buffer 320.

The memory cell array 310 may include a plurality of bank arrays 310a to 310h. The row decoder 260 may include a plurality of row decoders 260a to 260h each connected to the bank arrays 310a to 310h, the column decoder 270 may include a plurality of column decoders 270a to 270h each connected to the bank arrays 310a to 310h, and the sense amplifier unit 285 may include a plurality of sense amplifiers 285a to 285h each connected to the bank arrays 310a to 310h.

The plurality of bank arrays 310a to 310h, the plurality of sense amplifiers 285a to 285h, the plurality of column decoders 270a to 270h, and the plurality of row decoders 260a to 260h may include first to eighth banks, respectively. Each of the first to eighth bank arrays 310a to 310h may include a plurality of word lines WL, a plurality of bit lines BTL, and a plurality of memory cells MC formed at points where the word lines WL and the bit lines BTL intersect with each other.

The address register 220 may receive an address ADDR including a bank address BANK_ADDR, a row address ROW_ADDR, and a column address COL_ADDR from the memory controller 100. The address register 220 may provide the received bank address BANK_ADDR to the bank control logic 230, provide the received row address ROW_ADDR to the row address multiplexer 240, and provide the received column address COL_ADDR to the column address latch 250.

The bank control logic 230 may generate bank control signals in response to the bank address BANK_ADDR. In response to the bank control signals, a row decoder corresponding to a bank address BANK_ADDR among first to eighth row decoders 260a to 260h may be activated, and a column decoder corresponding to the bank address BANK_ADDR among the plurality of column decoders 270a to 270h may be activated.

The row address multiplexer 240 may receive the row address ROW_ADDR from the address register 220 and receive a refresh row address REF_ADDR from the refresh counter 245. The row address multiplexer 240 may selectively output the row address ROW_ADDR or the refresh row address REF_ADDR as a row address RA. The row address RA output from the row address multiplexer 240 may be applied to each of the plurality of row decoders 260a to 260h.

The refresh counter 245 may sequentially increase or decrease the refresh row address REF_ADDR according to the control of the control logic circuit 210.

A row decoder activated by the bank control logic 230 among the plurality of row decoders 260a to 260h may decode the row address RA output from the row address multiplexer 240 to activate a word line corresponding to the row address. For example, the activated row decoder may apply a word line driving voltage to the word line corresponding to the row address.

The column address latch 250 may receive the column address COL_ADDR from the address register 220 and temporarily store the received column address COL_ADDR. In addition, the column address latch 250 may gradually increase the received column address COL_ADDR in a burst mode. The column address latch 250 may apply the temporarily stored or gradually increased column address COL_ADDR to each of the plurality of column decoders 270a to 270h.

A column decoder activated by the bank control logic 230 among the plurality of column decoders 270a to 270h may activate a sense amplifier corresponding to the bank address BANK_ADDR and the column address COL_ADDR through the corresponding input/output gating circuit 290.

The input/output gating circuit 290 may include an input data mask logic, read data latches for storing data output from the plurality of bank arrays 310a to 310h, and write drivers for writing data to the plurality of bank arrays 310a to 310h, together with circuits for gating input/output data.

A codeword CW to be read from one of the plurality of bank arrays 310a to 310h may be sensed by a sense amplifier corresponding to one of the bank arrays 310a to 310h and be stored in the read data latches. The codeword CW stored in the read data latches may be ECC-decoded by the ECC engine 390 and provided to the data input/output buffer 320 as data DTA, and the data input/output buffer 320 may convert the data DTA into a data signal DQ based on an output clock signal OCLK and provide the data signal DQ to the memory controller 100 together with the strobe signal DQS.

A data signal DQ to be written into one of the plurality of bank arrays 310a to 310h may be converted into data DTA by the data input/output buffer 320 and provided to the ECC engine 390. The ECC engine 390 may generate parity bits based on the data DTA and provide a codeword CW including the data DTA and the parity bits to the input/output gating circuit 290. The input/output gating circuit 290 may write the codeword CW to a target page of the corresponding one of the bank arrays 310a to 310h through the write drivers.

The data input/output buffer 320 may convert the data signal DQ into the data DTA and provide the data DTA to the ECC engine 390 in a write operation, and may convert the data DTA provided from the ECC engine 390 into the data signal DQ based on the output clock signal OCLK provided from the clock generation circuit 600 and provide the data signal DQ and the strobe signal DQS to the memory controller 100 in a read operation. That is, the data input/output buffer 320 may output the data signal DQ to the outside based on the output clock signal OCLK in the read operation.

The ECC engine 390 may perform ECC encoding and ECC decoding on the data signal DQ based on a first control signal CTL1 from the control logic circuit 210.

The clock buffer 225 may receive the clock signal CK, buffer the clock signal CK to generate an internal clock signal ICK, and provide the internal clock signal ICK to components processing the command CMD and the address ADDR.

The data clock buffer 235 may receive the data clock signal WCK including a pair of differential clock signals WCK_c and WCK_t, generate a first clock signal (in-phase clock signal) CLKI and a second clock signal (quadrature clock signal) CLKQ having a phase difference of 90° therebetween based on the data clock signal WCK, and provide the first clock signal CLKI and the second clock signal CLKQ to the QEC 400.

The QEC 400 may correct a skew between the first clock signal CLKI and the second clock signal CLKQ and duty errors of the first clock signal CLKI and the second clock signal CLKQ to generate corrected clock signals CCLKI and CCLKQ having a phase difference of 90° therebetween, and provide the corrected clock signals CCLKI and CCLKQ to the clock generation circuit 600.

The clock generation circuit 600 may generate the output clock signal OCLK and the strobe signal DQS based on the corrected clock signals CCLKI and CCLKQ, and provide the output clock signal OCLK and the strobe signal DQS to the data input/output buffer 320. The output clock signal may be a plurality of clock signals having different phases. Specifically, the output clock signal will be described with reference to the drawings after FIG. 4.

The control logic circuit 210 may control an operation of the semiconductor memory device 200. For example, the control logic circuit 210 may generate control signals so that the semiconductor memory device 200 performs the write operation or the read operation. The control logic circuit 210 may include a command decoder 211 for decoding the command CMD received from the memory controller 100 and a mode register 212 for setting an operation mode of the semiconductor memory device 200.

For example, the command decoder 211 may generate the control signals corresponding to the command CMD by decoding a write enable signal, a row address strobe signal, a column address strobe signal, a chip select signal, and the like. In particular, the control logic circuit 210 may generate the first control signal CTL1 for controlling the ECC engine 390, a second control signal CTL2 for controlling the QEC 400, and a third control signal CTL3 for controlling the clock generation circuit 600 by decoding the command CMD.

Figure 3:
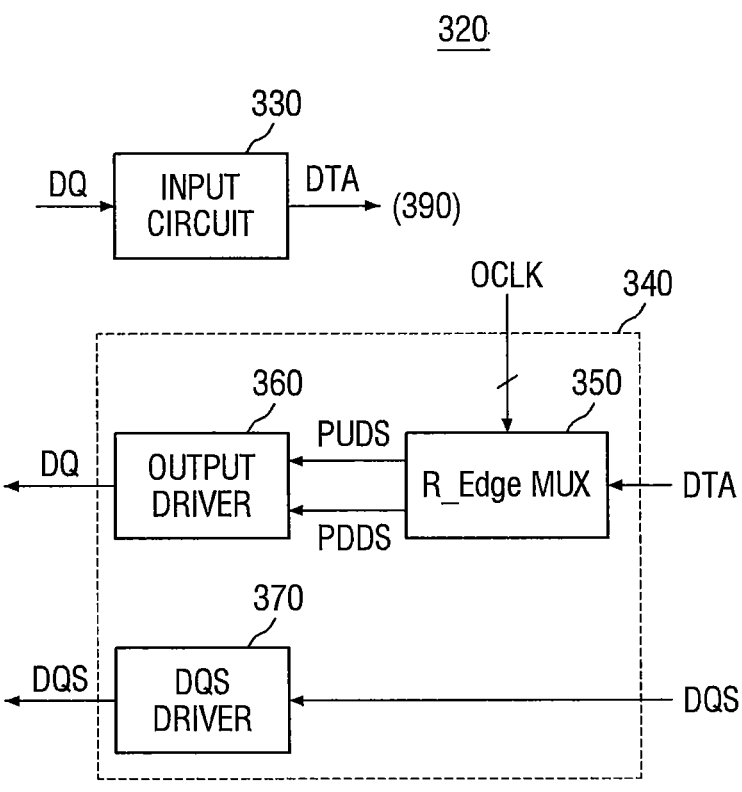
FIG. 3 illustrates a data input/output buffer 320 of FIG. 2 according to some embodiments

FIG. 3 illustrates a data input/output buffer 320 of FIG. 2 according to some embodiments.

Referring to FIG. 3, the data input/output buffer 320 may include a data input circuit 330 and a data output circuit 340. The data output circuit 340 may include a rising edge multiplexer (R_Edge MUX) 350, an output driver 360, and a strobe driver (DQS driver) 370.

The data input circuit 330 may receive the data signal DQ from the memory controller 30, convert the data signal DQ into the data DTA, and provide the data DTA to the ECC engine 390. The data output circuit 340 may convert the data DTA from the ECC engine 390 into the data signal DQ and transmit the data signal DQ to the memory controller 100 of FIG. 1.

The rising edge multiplexer 350 may receive the data DTA and the output clock signal OCLK, generate a pull-up driving signal PUDS and a pull-down driving signal PDDS based on the data DTA and the output clock signal OCLK, and provide the pull-up driving signal PUDS and the pull-down driving signal PDDS to the output driver 360. The rising edge multiplexer 350 may generate the pull-up driving signal PUDS and the pull-down driving signal PDDS by sampling the data DTA based on the output clock signal OCLK. The output clock signal OCLK may include four output clock signals having different phases.

Figure 4:
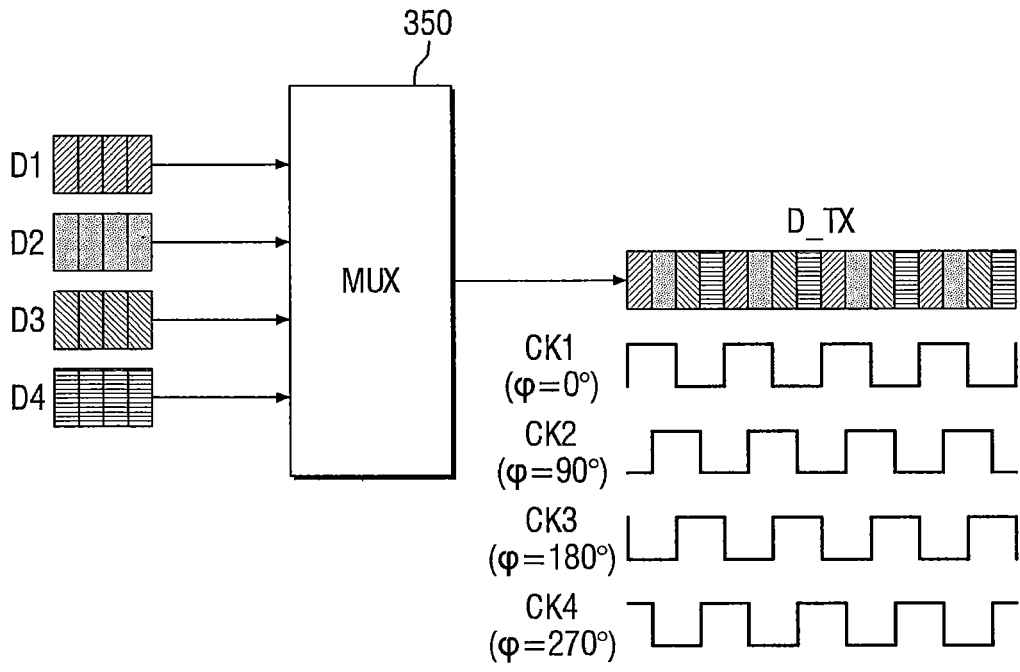
FIG. 4 is a diagram for describing a serializing operation of the semiconductor memory device according to some embodiments.

FIG. 4 is a diagram for describing a serializing operation of the semiconductor memory device according to some embodiments.

Referring to FIGS. 3 and 4, the rising edge multiplexer 350 may serialize data signals DTA (see FIG. 3), that is, D1, D2, D3, and D4, input in parallel in response to clock signals CK1 to CK4 into one data signal D_TX and output the one data signal D_TX. Specifically, referring to FIG. 4, the rising edge multiplexer 350 may output the data signal D1 in response to the clock signal CK1, output the data signal D2 in response to the clock signal CK2, output the data signal D3 in response to the clock signal CK3, and output the data signal D4 in response to the clock signal CK4. The serial data signal D_TX may be output in response to rising edges of the clock signals CK1, CK2, CK3, and CK4. An example embodiment is not limited thereto, and the rising edge multiplexer 350 may convert N parallel signals into one serial signal D_TX.

Figure 5:
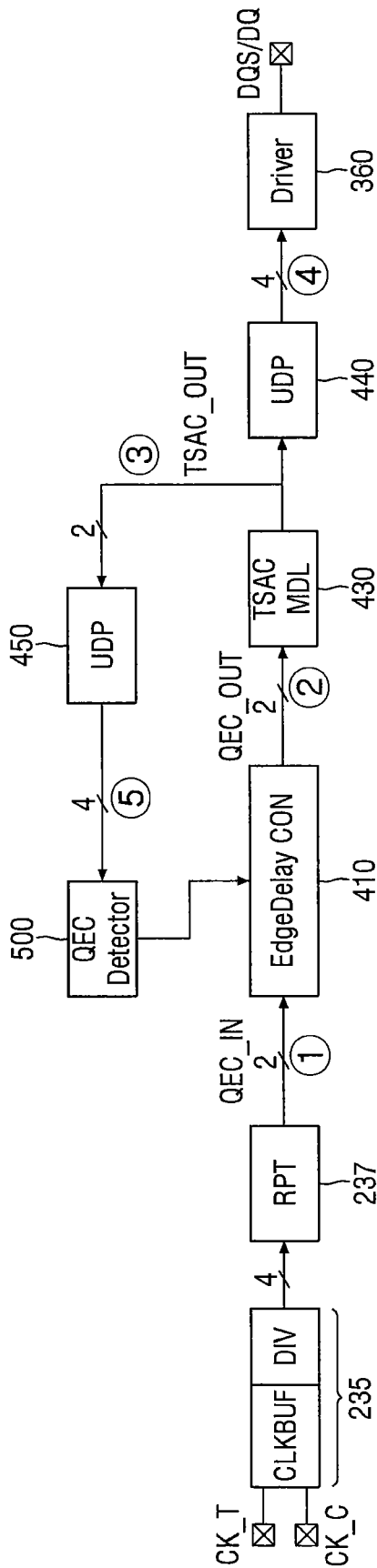
FIG. 5 is a block diagram illustrating a clock buffer, a QEC, and a clock generation circuit of FIG. 2 according to some embodiments.
Figure 6:
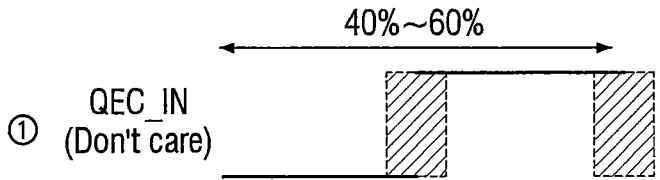
FIGS. 6 and 7 are timing charts for describing an operation of the QEC of FIG. 5.
Figure 6:
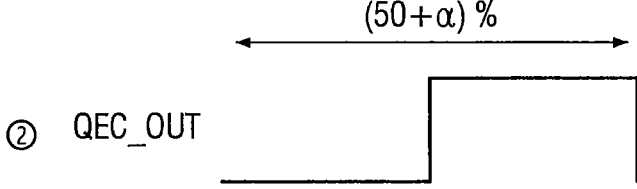
Figure 6:
Figure 7:
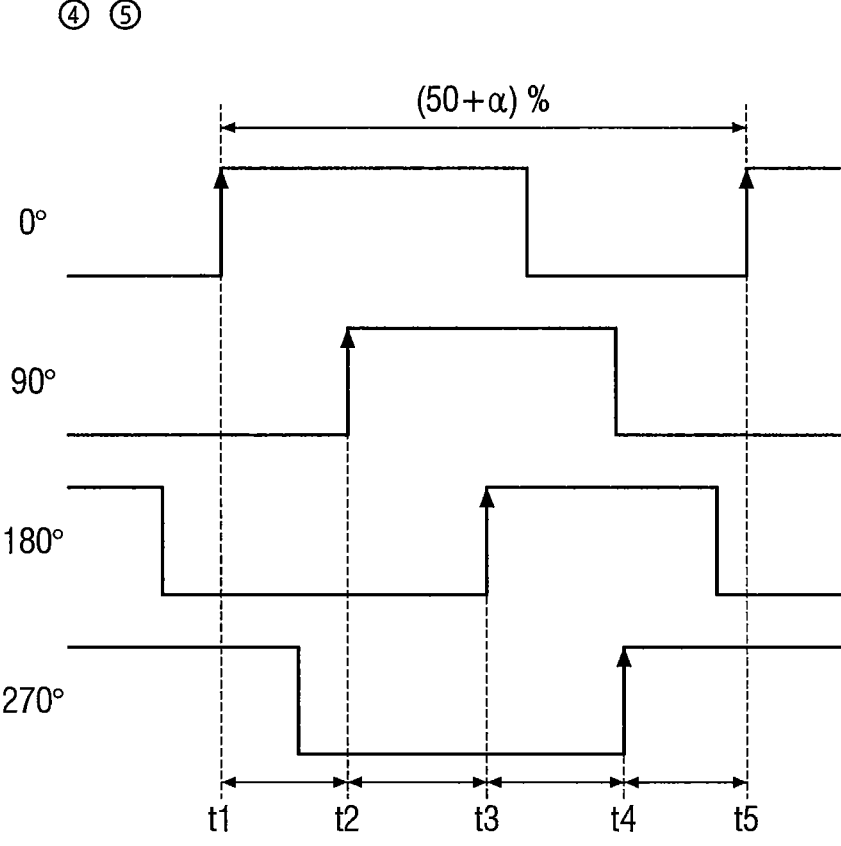

FIG. 5 is a block diagram illustrating a clock buffer, a QEC, and a clock generation circuit of FIG. 2 according to some embodiments. FIGS. 6 and 7 are timing charts for describing an operation of the QEC of FIG. 5.

Referring to FIGS. 5 to 7, a clock buffer 235 receives a pair of differential clock signals CK_T and CK_C having opposite phases (e.g., 180°) to each other, divides the pair of differential clock signals into clock signals having four different phases (e.g., clock signals having a phase difference of 90° therebetween) and outputs the four divided clock signals. As an example, the clock buffer 235 of FIG. 5 may be the data clock buffer 235 of FIG. 2.

A repeater 237 may generate the four divided clock signals as a pair of differential input signals QEC_IN. The pair of differential input signals QEC_IN may include a clock signal (in-phase clock signal) CLKI and a clock signal (quadrature clock signal) CLKQ as illustrated in ① of FIG. 6, and may be provided to the QEC 400. In this case, a duty ratio of the internally generated clock signal CLKI or clock signal CLKQ may not be 50%. For example, the internally generated clock signal CLKI or clock signal CLKQ may have a duty ratio of 40% to 60%. According to some embodiments, the repeater 237 may include at least one buffer.

The quadrature error correction circuit (QEC) 400 may include an edge delay controller 410, a tSAC matching delay line circuit (TSAC MDL) 430, two unit delay paths (UDPs) 440 and 450, and a QEC detector 500.

The edge delay controller 410 corrects duty errors of the first clock signal CLKI and the second clock signal CLKQ according to a control code output from the QEC detector 500 to generate a pair of corrected clock signals QEC_OUT between which a duty cycle is adjusted. For example, even when the edge delay controller 410 receives the differential input signals QEC_IN having a duty ratio of 40%, the corrected clock signals may have a preset duty ratio as illustrated in ② of FIG. 6 according to the control code. For example, the preset duty ratio may be (50+α)% in which a delay α in the UDP 450 is reflected. The delay α may be a value that varies depending on a state such as a processing operation, an operating voltage, and/or an operating temperature of the semiconductor memory device. The pair of corrected clock signals QEC_OUT may be output to the UDP 440.

A first UDP 440 delays the pair of corrected clock signals QEC_OUT by a preset unit clock and outputs the pair of delayed corrected clock signals QEC_OUT to a driver 360. For example, a first corrected clock signal QEC_OUT1 may be delayed as an in-phase clock signal through even-numbered (e.g., two) unit inverters, and a second corrected clock signal QEC_OUT2 may be delayed as a quadrature clock signal through odd-numbered (e.g., one) unit inverters.

The TSAC MDL 430 delays and outputs the pair of corrected clock signals QEC_OUT by a preset time tSAC. tSAC is a time required for data to be output through an output buffer after the pair of differential clock signals CK_T and CK_C is input to the clock buffer 235. The TSAC MDL 430 outputs a pair of delayed clock signals TSAC_OUT generated by delaying the pair of corrected clock signals QEC_OUT to the first UDP 440 and a second UDP 450. For example, a pair of delayed clock signals TSAC_OUT I and TSAC_OUT Q may maintain a constant duty ratio of 53% as illustrated in ③ of FIG. 6.

The first UDP 440 may be connected to an output path, and may receive the pair of delayed clock signals TSAC_OUT and generate output clock signals OCLK having four different phases. For example, the first UDP 440 may generate a pair of first output clock signals CLK I and CLK IB based on a first delayed clock signal TSAC_OUT I, and generate a pair of second output clock signals CLK Q and CLK QB based on a second delayed clock signal TSAC_OUT Q.

The second UDP 450 may be connected to a feedback path, and may receive the pair of delayed clock signals TSAC_OUT and generate output clock signals OCLK having four different phases. For example, the second UDP 450 may generate a pair of first output clock signals CLK I and CLK IB based on the first delayed clock signal TSAC_OUT I, and generate a pair of second output clock signals CLK Q and CLK QB based on the second delayed clock signal TSAC_OUT Q.

That is, the first UDP 440 and the second UDP 450 are similar circuits, and are similar as each other in that they generate the four output clock signals OCLK and OCLK' from the pair of delayed clock signals TSAC_OUT. For example, the first UDP 440 and the second UDP 450 may each generate the four output clock signals OCLK and OCLK' having a phase difference of 90° therebetween as illustrated in FIG. 7. In this case, time differences between rising edges of the four output clock signals may be almost the same as each other. For example, a time difference $\Delta t1$ (=t2−t1) between a rising edge (time t1) of CLK 0 and a rising edge (time t2) of CLK 90, a time difference $\Delta t2$ (=t3−t2) between the rising edge (time t2) of CLK 90 and a rising edge (time t3) of CLK 180, a time difference $\Delta t3$ (=t4−t3) between the rising edge (time t3) of CLK 180 and a rising edge (time t4) of CLK 270, and a time difference $\Delta t4$ (=t5−t4) between the rising edge (time t4) of CLK 270 and the next rising edge (time t5) of CLK 0 may be adjusted to be almost the same as each other ($\Delta t1 \approx \Delta t2 \approx \Delta t3 \approx \Delta t4$).

Even though a skew of a duty cycle occurs while the first UDP 440 generates the four output clock signals, unlike an example illustrated in FIG. 7, a duty error may be corrected using the second UDP 450, which is similar circuit as the first UDP 440.

According to some embodiments, the QEC 400 generates the same duplicate clock signals OCLK' as the output path through the second UDP 450 in the feedback path, such that the QEC detector 500 detects a duty error or a skew that may occur during an operation of the first UDP 440, and transmits a corresponding control code to the edge delay controller 410. The edge delay controller 410 may pre-reflect the duty error or the skew in the pair of corrected clock signals QEC_OUT according to the control code received from the QEC detector 500. That is, the edge delay controller 410 may adjust duty ratios of the pair of corrected clock signals QEC_OUT according to a current control code.

That is, the QEC detector 500 detects a rising edge of each of the duplicate clock signals OCLK', and generates a control code making a time difference between two duplicate clock signals of which the rising edges are adjacent to each other (time difference between the rising edges, for example, Δt in FIG. 7) uniform.

The QEC detector 500 may calculate skew information from the time differences between the rising edges of the four output clock signals OCLK, that is, I, IB, Q, and QB, generated by the second UDP 450 and output the control code corresponding to the calculated skew information. For example, the QEC detector 500 may calculate skew information between the output clock signal CLK I and the output clock signal CLK Q, calculate skew information between the output clock signal CLK Q and CLK IB, calculate skew information between the output clock signal CLK IB and the output clock signal QB, and calculate skew information between the output clock signal CLK QB and the next output clock signal I.

The rising edge multiplexer 350 and the driver 360 serially output data according to the four output clock signals OCLK generated by the first UDP 440. According to some embodiments, the rising edge multiplexer 350 serially outputs data using the rising edges of the four output clock signals.

Figure 8:
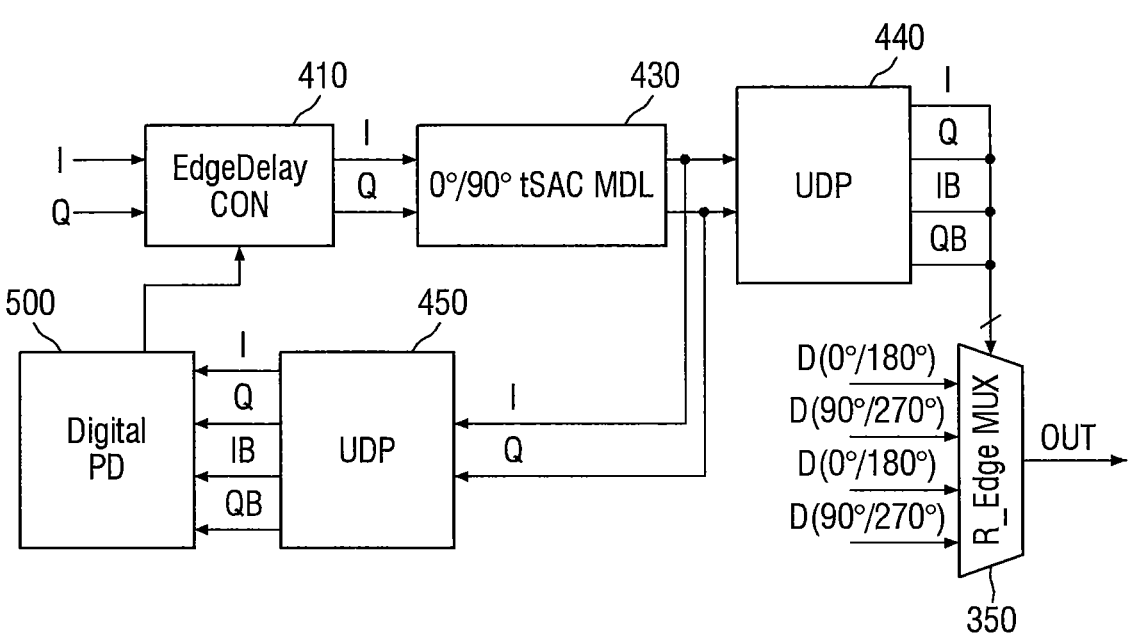
FIGS. 8 to 10 are block diagrams illustrating the QEC 400 and the clock generation circuit 600 of FIG. 2 according to some embodiments.
Figure 9:
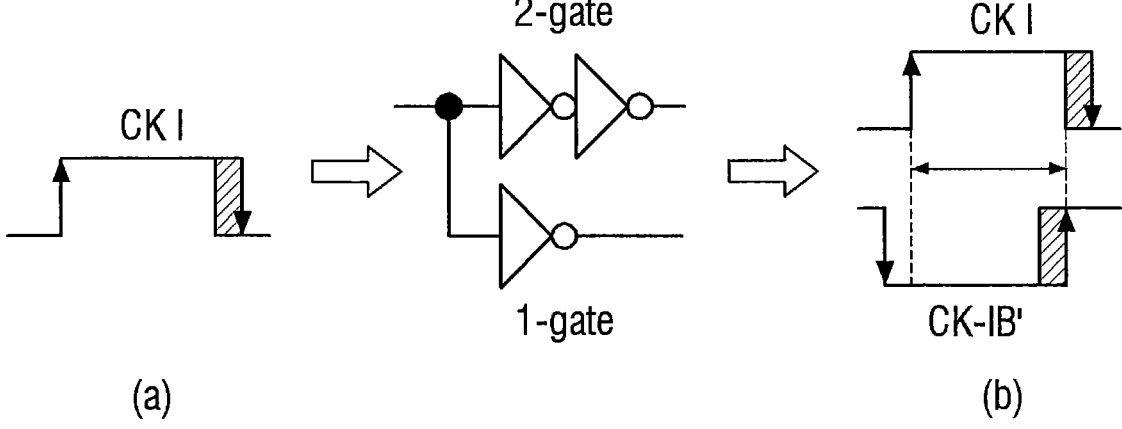
Figure 10:
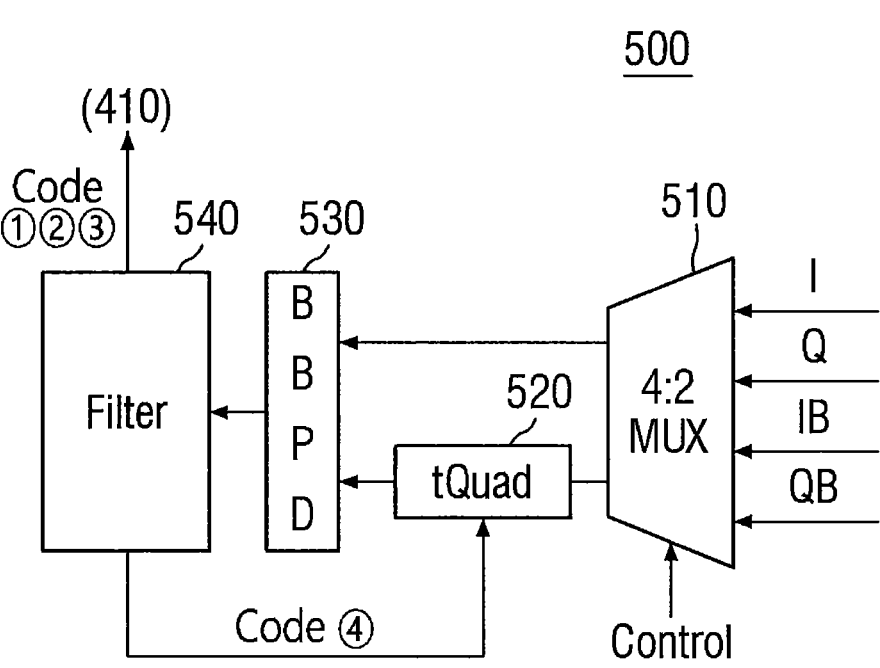

FIGS. 8 to 10 are block diagrams illustrating the QEC 400 and the clock generation circuit 600 of FIG. 2 according to some embodiments in more detail.

Referring to FIG. 8, the edge delay controller 410 receives the control code from the QEC detector 500, and receives the pair of differential input signals QEC_IN including the clock signal (in-phase clock signal) CLK I and the clock signal (quadrature clock signal) CLK Q having a phase difference of 90° therebetween.

The edge delay controller 410 adjusts a duty cycle between the clock signal CLK I and the clock signal CLK Q based on the control code and outputs the pair of corrected clock signals QEC_OUT. For example, the pair of corrected clock signals QEC_OUT may include the clock signal CLK I and the clock signal CLK Q of which the duty cycle is adjusted. In some embodiments, for example, the pair of corrected clock signals QEC_OUT may include the clock signal CLK I of which the duty cycle is adjusted and the clock signal CLK Q. In some embodiments, for example, the pair of corrected clock signals QEC_OUT may include the clock signal CLK I of which the duty cycle is adjusted and the clock signal CLK Q of which the duty cycle is adjusted. Accordingly, a phase difference between the clock signal CLK I' and the clock signal CLK Q' included in the pair of corrected clock signals QEC_OUT may not be 90°. For example, the clock signal CLK I' and the clock signal CLK Q' may have a phase difference greater than 90° therebetween or have a phase difference less than 90° therebetween.

The TSAC MDL 430 delays by a preset time tSAC and outputs the pair of corrected clock signals QEC_OUT.

The first UDP 440 may include a plurality of unit inverters to output the pair of delayed clock signals TSAC_OUT as output clock signals OCLK having four phases. The output clock signals OCLK are provided to the rising edge multiplexer 350 of the output buffer 320. The output clock signals OCLK include an output clock signal CLK I, an output clock signal CLK Q, an output clock signal CLK IB, and an output clock signal CLK QB.

For example, referring to FIG. 9, a delayed clock signal CK I" may be output as the output clock signal CLK I through two inverters, the delayed clock signal CK I" may be output as the output clock signal CLK IB through one inverter, a delayed clock signal CK Q" may be output as the output clock signal CLK Q through two inverters, and the delayed clock signal CK Q" may be output as the output clock signal CLK QB through one inverter.

The rising edge multiplexer 350 may serialize data input in parallel according to the four output clock signals OCLK and serially output the data, as described with reference to FIG. 4. The rising edge multiplexer 350 outputs data OUT in synchronization with the rising edge of each of the output clock signal CLK I, the output clock signal CLK Q, the output clock signal CLK IB, and the output clock signal CLK QB.

The second UDP 450 may be implemented in the same manner as the first UDP 440. The second UDP 450 may be connected to the feedback path between the TSAC MDL 430 and the edge delay controller 410. The second UDP 450 may generate the pair of delayed clock signals TSAC_OUT as duplicate clock signals OCLK" having four phases and output the duplicate clock signals OCLK" to a digital phase detector 500.

Referring to FIG. 10, the QEC detector 500 of FIG. 5 may be implemented as the digital phase detector according to some embodiments. The digital phase detector 500 according to some embodiments may include a 4:2 multiplexer 510, a tQuad module 520, a Bang Bang phase detector (BBPD) 530, and a filter 540.

The 4:2 multiplexer 510 may selectively output two of the four clock signals received from the second UDP 450 according to a control signal Control. The control signal Control controls the 4:2 multiplexer 510 to output two adjacent clock signals of the four clock signals CK I, CK Q, CK IB, and CK QB. For example, the 4:2 multiplexer 510 may select and output the clock signal CK I and the clock signal CK Q, select and output the clock signal CK Q and the clock signal CK IB, select and output the clock signal CK IB and the clock signal CK QB, or select and output the clock signal CK QB and the clock signal CK I, according to the control signal Control.

The tQuad module 520 delays and outputs one of the two output clock signals output from the 4:2 multiplexer 510 by a predefined time tQuad. According to some embodiments, the tQuad module 520 may be a circuit delaying and outputting an input signal by a preset time tQuad corresponding to a phase shift of 90°, and may include at least one buffer. For example, when a first output clock signal CLK I is output from the 4:2 multiplexer 510 at time t1, a second output clock signal CLK Q may be output at time t1+tQuad through the tQuad module 520.

The BBPD 530 detects edges of the two clock signals and compares positions of the edges of the first and second clock signals with each other to determine whether the second clock signal leads the first clock signal or lags behind the first clock signal. For example, the BBPD 530 may compare rising edges of the first output clock signal CLK I selected and output from the 4:2 multiplexer 510 and the second output clock signal CLK Q delayed by tQuad with each other and output skew detection values between four phase clocks.

The filter 540 may output control codes corresponding to the skew detection values output from the BBPD 530. According to some embodiments, the control code Code ①②③ is output to the edge delay controller 410, such that the pair of corrected clock signals QEC_OUT of which the duty errors are adjusted may be output or the pair of delayed clock signals TSAC_OUT of which the duty errors are adjusted may be output. According to some embodiments, the control code Code ④ may be output to the tQuad module 520 to adjust a length of tQuad.

Figure 11:
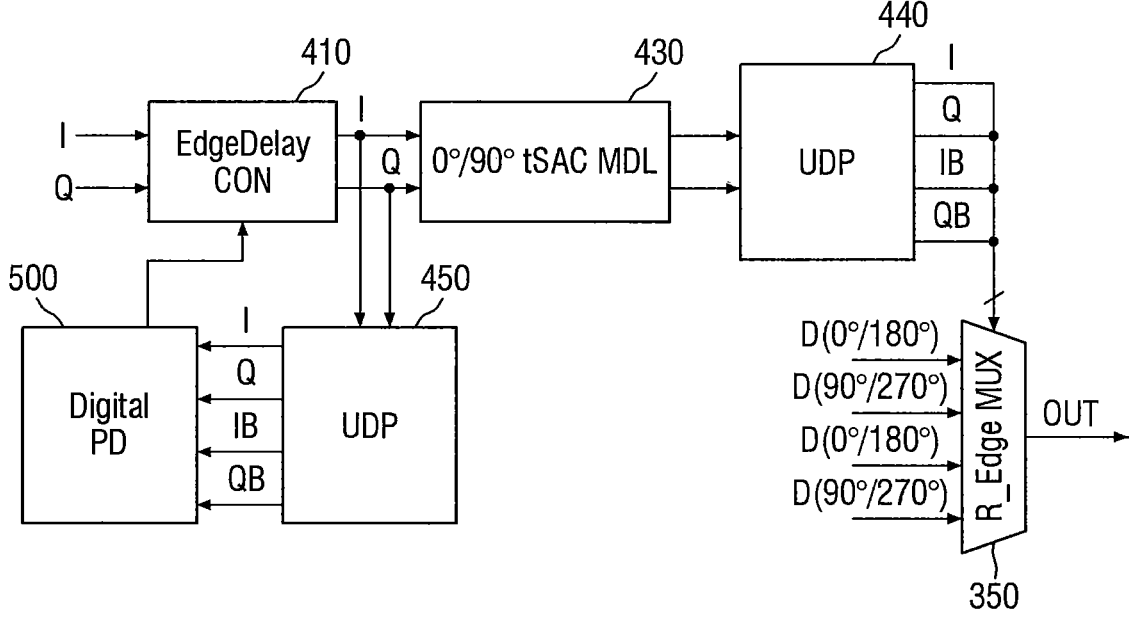
FIG. 11 is a block diagram illustrating the clock buffer, the QEC, and the clock generation circuit of FIG. 5 according to some embodiments.

FIG. 11 is a block diagram illustrating the clock buffer, the QEC, and the clock generation circuit of FIG. 5 according to some embodiments in more detail. For convenience of explanation, contents different from those of FIG. 8 will be mainly described, and an overlapping description will be omitted.

Referring to FIG. 11, according to some embodiments, the QEC 400 may connect a feedback path between an output terminal and an input terminal of the edge delay controller 410. That is, the second UDP 450 may receive the pair of corrected clock signals QEC_OUT input to the TSAC MDL 430 and generate four duplicate clock signals.

As in FIG. 8, the first UDP 440 and the second UDP 450 are a similar circuit, and are similar as each other in that they generate the four output clock signals OCLK and OCLK' from the pair of corrected clock signals QEC_OUT. The second UDP 450 generates the same duplicate clock signals OCLK' (i.e., same phase and period) as the output path through the feedback path, such that the QEC detector 500 detects a duty error or a skew that may occur during an operation of the first UDP 440, and transmits a corresponding control code to the edge delay controller 410. The edge delay controller 410 may pre-reflect the duty error or the skew in the pair of corrected clock signals QEC_OUT according to the control code received from the QEC detector 500. That is, the edge delay controller 410 may adjust duty ratios of the pair of corrected clock signals QEC_OUT according to a current control code.

According to some embodiments, when the feedback path is configured as illustrated in FIG. 8, the QEC detector 500 may detect a duty error and a skew that may occur in the TSAC MDL 430 and the first UDP 440 to correct the error.

Meanwhile, according to some embodiments, when the feedback path is configured as illustrated in FIG. 11, the QEC detector 500 may detect a duty error and a skew that may occur in the first UDP 440 to correct the error. However, unlike the example embodiments of FIG. 8, there is an effect that an error may be detected and corrected while consuming less power.

Figure 12:
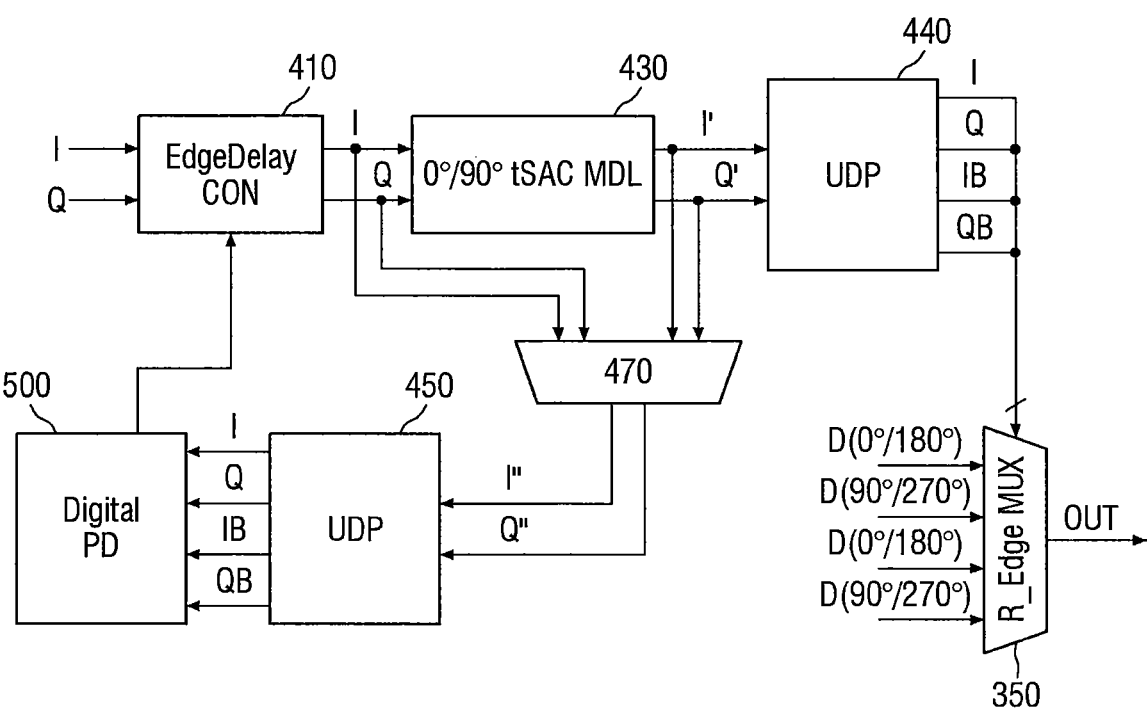
FIG. 12 is a block diagram illustrating the clock buffer, the QEC, and the clock generation circuit of FIG. 5 according to some embodiments.

FIG. 12 is a block diagram illustrating the clock buffer, the QEC, and the clock generation circuit of FIG. 5 according to some embodiments in more detail. For convenience of explanation, contents different from those of FIGS. 8 and 11 will be mainly described, and an overlapping description will be omitted.

Referring to FIG. 12, according to some embodiments, the QEC 400 may further include a selector 470 receiving each of the pair of corrected clock signals QEC_OUT of an input terminal of the TSAC MDL 430 and the pair of delayed clock signals TSAC_OUT of an output terminal of the TSAC MDL 430.

The pair of corrected clock signals QEC_OUT include a clock signal CLK I and a clock signal CLK Q output in a state in which a duty cycle is adjusted in the edge delay controller 410. The pair of delayed clock signals TSAC_OUT include a delayed clock signal CLK I' and a delayed clock signal CLK Q' output in a state in which the pair of corrected clock signals QEC_OUT are delayed by a preset time tSAC.

According to some embodiments, the selector 470 may select either the pair of corrected clock signals QEC_OUT or the pair of delayed clock signals TSAC_OUT as a pair of feedback clock signals according to a selection control signal of the semiconductor memory device and output the selected pair of clock signals to the second UDP 450.

According to some embodiments, the selector 470 may calculate a pair of feedback clock signals by a delay average of the pair of corrected clock signals QEC_OUT and the pair of delayed clock signals TSAC_OUT and output the pair of feedback clock signals to the second UDP 450.

In some embodiments, according to some embodiments, in an initial training stage of the semiconductor memory device, the selector 470 may store each of a first offset in the pair of corrected clock signals QEC_OUT and a second offset in the pair of delayed clock signals TSAC_OUT and calculate a relationship value between the first offset and the second offset. In an actual operation of the semiconductor memory device, the selector 470 may receive only the pair of corrected clock signals QEC_OUT, but may output selected clock signals by reflecting the relationship value to the pair of corrected clock signals in the actual operation.

The second UDP 450 may receive the selected pair of clock signals CLK I" and CLK Q" and generate four duplicate clock signals.

Figure 13:
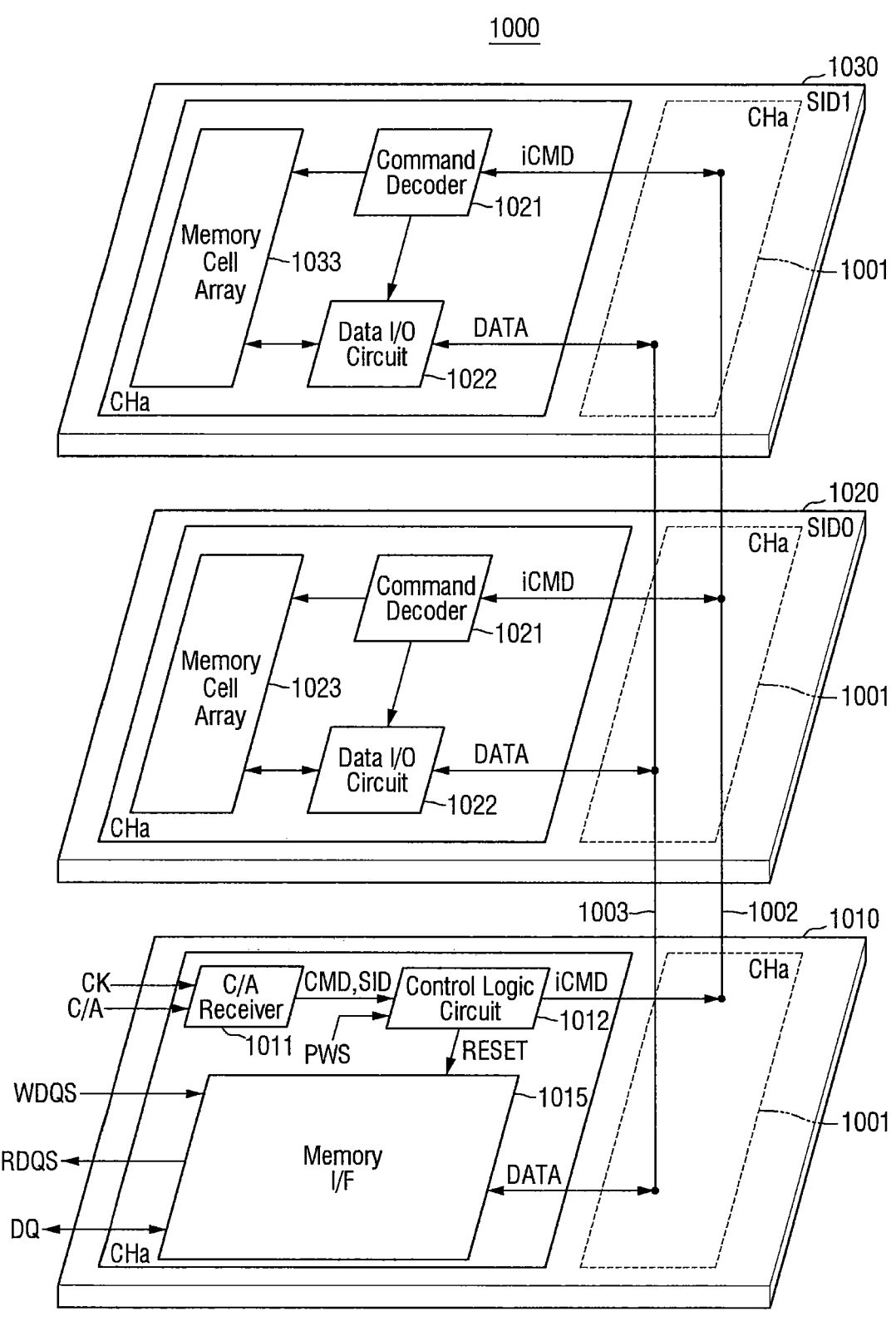
FIG. 13 is a block diagram of a stacked memory device according to some embodiments.

FIG. 13 is a block diagram of a stacked memory device according to some embodiments.

Referring to FIG. 13, a stacked memory device 1000 may include a buffer die 1010, a first core die 1020, and a second core die 1030. The first core die 1020 and the second core die 1030 may support the same channel CHa of a plurality of channels. In this case, the core dies 1020 and 1030 may be distinguished from each other by stack IDs (SIDs). For example, the first core die 1020 may correspond to a first stack ID SID0, and the second core die 1030 may correspond to a second stack ID SID1. It has been illustrated in FIG. 13 that another core die does not exist between the first core die 1020 and the second core die 1030, but another core die may be positioned between the first core die 1020 and the second core die 1030, in some embodiments.

The buffer die 1010 and the core dies 1020 and 1030 may communicate with each other through through-silicon vias (TSVs) 1002 and 1003 positioned in a TSV area 501. For example, the buffer die 1010 may transmit an internal command iCMD to the first core die 1020 and/or the second core die 1030 through the TSV 1002, and transmit and receive data DATA to and from the first core die 1020 and/or the second core die 1030 through the TSV 1003. It has been illustrated in FIG. 13 that the buffer die 1010 communicates with the core dies 1020 and 1030 using the same TSVs 1002 and 1003, but the buffer die 1010 may communicate with the core dies 1020 and 1030 using separate TSVs each corresponding to the core dies 1020 and 1030.

The second core die 1030 may include a command decoder 1031, a data input/output circuit 1032, and a memory cell array 1033. The command decoder 1031, the data input/output circuit 1032, and the memory cell array 1033 may operate in substantially the same manner as a command decoder 1021, a data input/output circuit 1022, and a memory cell array 1023 of the first core die 1020.

A C/A receiver 1011 may receive a command CMD and a stack ID SID by latching a command/address signal C/A based on a clock signal CK. The stack ID SID may be an address indicating at least one core die in order to distinguish core dies supporting the same channel from each other. The received command CMD and stack ID SID may be provided to a control logic circuit 1012.

The control logic circuit 1012 may transmit the internal command iCMD to at least one of the first core die 1020 and the second core die 1030 based on the stack ID SID. For example, when the stack ID SID indicates the first stack ID SID0, the control logic circuit 1012 may transmit the internal command iCMD to the first core die 1020.

In some embodiments, as illustrated in FIG. 8, when the internal command iCMD and the data DATA are transferred to the core dies 1020 and 1030 through common TSVs 1002 and 1003, the buffer die 1010 may transfer the stack ID SID to the core dies 1020 and 1030. The core dies 1020 and 1030 may selectively receive the internal command iCMD and the data DATA by decoding the transferred stack ID SID. For example, when the stack ID SID indicates the first stack ID SID0, the first core die 1020 may receive the internal command iCMD and the data DATA transferred through the TSVs 1002 and 1003. In this case, the second core die 1030 may not receive the internal command iCMD and the data DATA transferred through the TSVs 1002 and 1003.

In some embodiments, when the internal command iCMD and the data DATA are transferred to the core dies 1020 and 1030 through separate TSVs, the buffer die 1010 may transfer the internal command iCMD and the data DATA to the core die corresponding to the stack ID SID through the separate TSVs.

As described above, when the core dies 1020 and 1030 support the same channel CHa, the stacked memory device 1000 may perform a write operation and a read operation according to an active command or a refresh operation according to a refresh command, based on at least one of the first core die 1020 and the second core die 1030 according to the stack ID SID.

Figure 14:
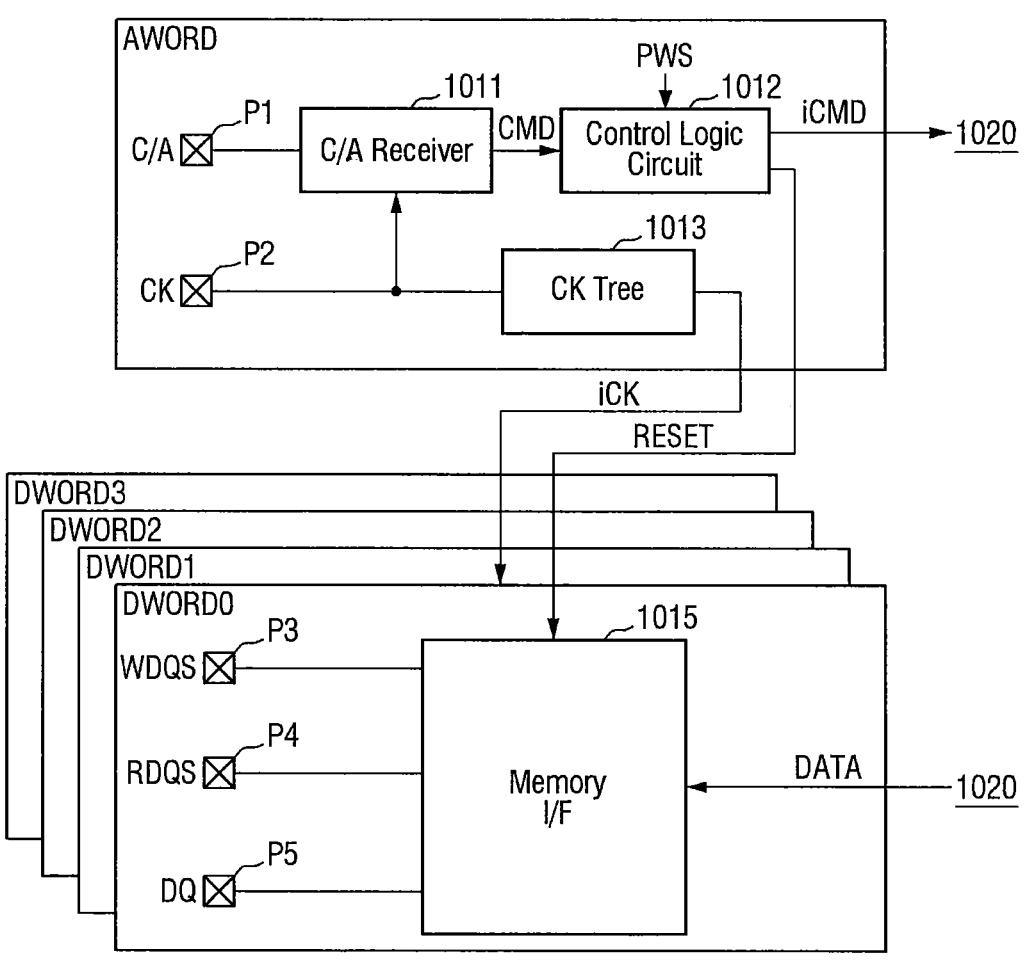
FIG. 14 is a block diagram illustrating an embodiment of a buffer die of FIG. 13.

FIG. 14 is a block diagram illustrating example embodiments of a buffer die of FIG. 13. Referring to FIG. 14, the buffer die 1010 may include a command address input/output block AWORD and data input/output blocks DWORD0 to DWORD3.

It will be described in FIG. 14 that the buffer die 1010 includes four data input/output blocks DWORD0 to DWORD3, but the buffer die 1010 may include various numbers of data input/output blocks. For example, the buffer die 1010 may include two data input/output blocks.

The command address input/output block AWORD may include a C/A receiver 1011, a control logic circuit 1012, and a clock tree 1016. The C/A receiver 1011 may receive a command CMD by latching a command/address signal C/A received from a pad P1 based on a clock signal CK received from a pad P2. The control logic circuit 1012 may generate a reset signal RESET based on the command CMD or power state information PWS, and transmit the reset signal RESET to each of the data input/output blocks DWORD0 to DWORD3. The control logic circuit 1012 may generate an internal command iCMD according to the command CMD and transmit the internal command iCMD to the core die 1020. The clock tree 1016 may be configured as an inverter chain including a plurality of inverters. An internal clock signal iCK generated from the clock signal CK through the clock tree 1016 may be transmitted to each of the data input/output blocks DWORD0 to DWORD3.

Each of the data input/output blocks DWORD0 to DWORD3 may receive the internal clock signal iCK and the reset signal RESET from the command address input/output block AWORD. Each of the data input/output blocks DWORD0 to DWORD3 may include a memory device interface 1015. The memory device interface 1015 is coupled to each core die. The memory device interface 1015 may transmit and receive a write data strobe signal WDQS to and from the core dies 1020 and 1030 through a pad P3, transmit and receive a read data strobe signal RDQS to and from the core dies 1020 and 1030 through a pad P4, and transmit and receive a data signal DQ to and from the core dies 1020 and 1030 through a pad P5.

As described above, the pad P2 at which the clock signal CK is received may be positioned in the command address input/output block AWORD, and the pads P3 and P4 at which the write data strobe signal WDQS and the read data strobe signal RDQS are received may be positioned in the data input/output block DWORD. The clock signal CK received by the command address input/output block AWORD may be transferred to the data input/output block DWORD through the clock tree 1016.

Figure 15:
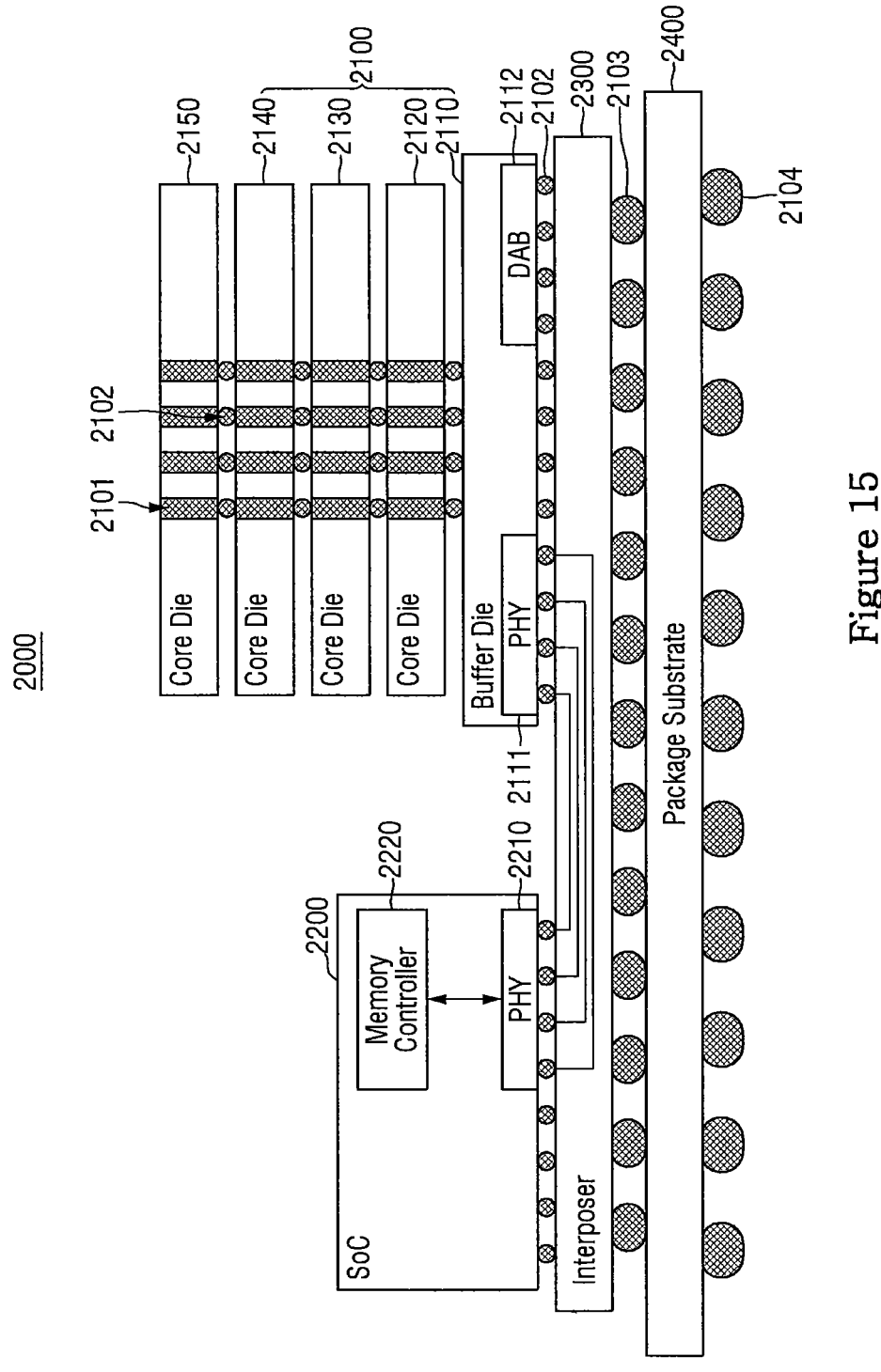
FIG. 15 is a view illustrating a semiconductor package according to some embodiments.

FIG. 15 is a view illustrating a semiconductor package according to some embodiments.

Referring to FIG. 15, a semiconductor package 2000 may include a stacked memory device 2100, a system-on-chip 2200, an interposer 2300, and a package substrate 2400. The stacked memory device 2100 may include a buffer die 2110 and core dies 2120 to 2150. The buffer die 2110 may correspond to the buffer die 1010 of FIG. 13, and each of the core dies 2120 to 2150 may correspond to each of the core dies 1020 to 1050 of FIG. 13.

Each of the core dies 2120 to 2150 may include a memory cell array. The buffer die 2110 may include a physical layer 2111 and a direct access area (DAB) 1112. The physical layer 2111 may be electrically connected to a physical layer 2210 of the system-on-chip 2200 through the interposer 2300. The stacked memory device 2100 may receive signals from the system-on-chip 2200 through the physical layer 2111 or transmit signals to the system-on-chip 2200 through the physical layer 2111. The physical layer 2111 may include interface circuits of the buffer die 1010 described with reference to FIG. 13.

The direct access area 2112 may provide an access path capable of testing the stacked memory device 2100 not through the system-on-chip 2200. The direct access area 2112 may include conductive access (e.g., ports or pins) that may communicate directly with an external test device. A test signal and data received through the direct access area 2112 may be transmitted to the core dies 2120 the 2150 through TSVs. In order to test the core dies 2120 to 2150, data read from the core dies 2120 to 2150 may be transmitted to the test device through the TSVs and the direct access area 2112. Accordingly, a direct access test for the core dies 2120 to 2150 may be performed.

The buffer die 2110 and the core dies 2120 to 2150 may be electrically connected to each other through TSVs 2101 and bumps 2102. The buffer die 2110 may receive signals provided to each channel from the system-on-chip 2200 through the bumps 2102 allocated for each channel. For example, the bumps 2102 may be micro bumps.

The system-on-chip 2200 may execute applications supported by the semiconductor package 2000 by using the stacked memory device 2100. For example, the system-on-chip 2200 may execute specialized operations by including at least one of a central processing unit (CPU), an application processor (AP), a graphic processing unit (GPU), a neural processing unit (NPU), a tensor processing unit (TPU), a vision processing unit (VPU), an image signal processor (ISP), and a digital signal processor (DSP).

The system-on-chip 2200 may include the physical layer 2210 and a memory controller 2220. The physical layer 2210 may include input/output circuits for transmitting and receiving signals to and from the physical layer 2111 of the stacked memory device 2100. The system-on-chip 2200 may provide various signals to the physical layer 2111 through the physical layer 2210. The signals provided to the physical layer 2111 may be transferred to the core dies 2120 to 2150 through the interface circuits and the TSVs 2101 of the physical layer 2111.

The memory controller 2220 may control an overall operation of the stacked memory device 2100. The memory controller 2220 may transmit signals for controlling the stacked memory device 2100 to the stacked memory device 2100 through the physical layer 2210. The memory controller 2220 may correspond to the memory controller 100 of FIG. 1.

The interposer 2300 may connect the stacked memory device 2100 and the system-on-chip 2200 to each other. The interposer 2300 may connect the physical layer 2111 of the stacked memory device 2100 and the physical layer 2210 of the system-on-chip 2200 to each other and provide physical paths formed using conductive materials. Accordingly, the stacked memory device 2100 and the system-on-chip 2200 may be stacked on the interposer 2300 to transmit and receive signals to and from each other.

Bumps 2103 may be attached to an upper portion of the package substrate 2400, and solder balls 2104 may be attached to a lower portion of the package substrate 2400. For example, the bumps 2103 may be flip-chip bumps. The interposer 2300 may be stacked on the package substrate 2400 through the bumps 2103. The semiconductor package 2000 may transmit and receive signals to and from other external packages or semiconductor devices through the solder balls 2104. For example, the package substrate 2400 may be a printed circuit board (PCB).

Figure 16:
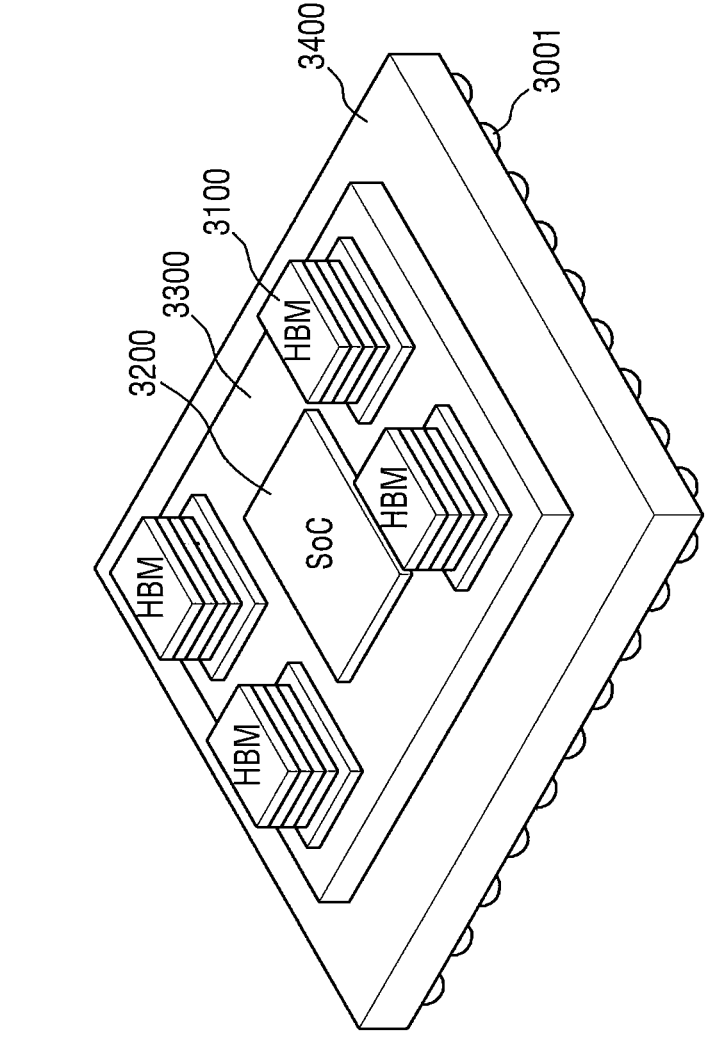
FIG. 16 is a view illustrating an implementation of a semiconductor package according to some embodiments.

FIG. 16 is a view illustrating an implementation of a semiconductor package according to some embodiments.

Referring to FIG. 16, a semiconductor package 3000 may include a plurality of stacked memory devices 3100 and a system-on-chip 3200. The stacked memory devices 3100 and the system-on-chip 3200 may be stacked on an interposer 3300, and the interposer 3300 may be stacked on a package substrate 3400. The semiconductor package 3000 may transmit and receive signals to and from other external packages or semiconductor devices through solder balls 3001 attached to a lower portion of the package substrate 3400.

Each of the stacked memory devices 3100 may be implemented based on a high bandwidth memory (HBM) standard. However, the present disclosure is not limited thereto, and each of the stacked memory devices 3100 may be implemented based on graphics double data rate (GDDR), hardware management console (HMC), or Wide I/O standards. Each of the stacked memory devices 3100 may correspond to the stacked memory devices 1000 and 2100 of FIGS. 13 to 16.

The system-on-chip 3200 may include at least one processor such as a CPU, an AP, a GPU, and an NPU, and a plurality of memory controllers for controlling the plurality of stacked memory devices 3100. The system-on-chip 3200 may transmit and receive signals to and from a corresponding stacked memory device through the memory controller. The system-on-chip 3200 may correspond to the system-on-chip 2200 of FIG. 15.

The example embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the embodiments described above are illustrative rather than being restrictive in all aspects.

What is claimed is:

1. A semiconductor memory device comprising:
   a data clock buffer configured to receive a data clock signal from a memory controller and output a pair of differential input signals;
   an edge delay controller configured to adjust duty ratios of the pair of differential input signals based on a control code and configured to output a pair of corrected clock signals;
   a first unit delay path circuit configured to generate four output clock signals having different phases based on the pair of corrected clock signals;
   a rising edge multiplexer configured to serially output data corresponding to a rising edge of each of the four output clock signals;
   a second unit delay path circuit configured to generate four duplicate clock signals having different phases based on the pair of corrected clock signals; and
   a quadrature error correction circuit (QEC) detector configured to detect a duty error based on the four duplicate clock signals having different phases and configured to output the control code corresponding to the duty error that was detected.

2. The semiconductor memory device of claim 1, further comprising:
   a preset time tSAC matching delay line circuit configured to generate a pair of delayed clock signals by delaying the pair of corrected clock signals output from the edge delay controller by a first time, and configured to provide the pair of delayed clock signals to the first unit delay path circuit.

3. The semiconductor memory device of claim 2, wherein the second unit delay path circuit is configured to receive the pair of delayed clock signals and generate the four duplicate clock signals.

4. The semiconductor memory device of claim 1, wherein the first unit delay path circuit is configured to perform operations comprising:
   generating a first corrected clock signal of the pair of corrected clock signals as a first output clock signal through two first inverters,
   generating the first corrected clock signal as a second output clock signal through a second inverter,
   generating a second corrected clock signal of the pair of corrected clock signals as a third output clock signal through two third inverters, and
   generating the second corrected clock signal as a fourth output clock signal through a fourth inverter.

5. The semiconductor memory device of claim 4, wherein the second unit delay path circuit is a same circuit as the first unit delay path circuit.

6. The semiconductor memory device of claim 1, wherein the QEC detector comprises:
   a 4:2 multiplexer configured to receive the four duplicate clock signals and select and output two duplicate clock signals according to a control signal;
   a tQuad module configured to delay a first duplicate clock signal of the two duplicate clock signals that were selected by a second time;
   a phase detector configured to compare rising edges of a second duplicate clock signal of the two duplicate clock signals that were selected and delay a first duplicate clock signal with respect to a second duplicate clock signal of the two duplicate clock signals, and output a skew detection value between the first duplicate clock signal that was delayed and the second duplicate clock signal; and a filter configured to output the control code corresponding to the skew detection value to the edge delay controller.

7. The semiconductor memory device of claim 6, wherein the filter is configured to output the control code to the tQuad module, and wherein the tQuad module is configured to adjust the second time based on the control code.

8. The semiconductor memory device of claim 6, wherein the phase detector comprises a Bang Bang phase detector.

9. A memory system comprising:

a memory controller configured to transmit a data clock signal and transmit and receive a serial data signal; and a semiconductor memory device configured to output data stored in a memory cell array as the serial data signal in synchronization with a rising edge of each of a plurality of output clock signals having different phases, wherein the semiconductor memory device comprises:

a data clock buffer configured to receive the data clock signal and generate a pair of differential input signals having two different phases;

a quadrature error correction circuit (QEC) configured to adjust duty cycles of the pair of differential input signals according to a control code and output a pair of corrected clock signals;

a first unit delay path circuit configured to generate the pair of corrected clock signals as the plurality of output clock signals;

a QEC detector configured to detect duty errors of the pair of differential input signals based on the pair of corrected clock signals and generate the control code; and a second unit delay path circuit configured to generate a plurality of duplicate clock signals that have a same phase and period as the plurality of output clock signals from the pair of corrected clock signals.

10. The memory system of claim 9, wherein the QEC detector is configured to detect a rising edge of each of the plurality of duplicate clock signals, and generate the control code such that there is a uniform time difference between two duplicate clock signals of the plurality of duplicate clock signals of which the rising edges are adjacent to each other.

11. The memory system of claim 9, wherein the QEC detector comprises:

an M:2 multiplexer configured to select and output two of the plurality of duplicate clock signals according to a control signal, wherein M is a natural number of 2 or more;

a phase detector configured to detect phases of the output of two duplicate clock signals and output a duty error as a skew detection value; and a filter configured to generate the control code based on the skew detection value.

12. The memory system of claim 11, wherein the QEC detector further comprises a tQuad module that is configured to delay a first duplicate clock signal of the two duplicate clock signals by a time set according to the control code and output the first duplicate clock signal that was delayed to the phase detector.

13. The memory system of claim 9, wherein the first unit delay path circuit is configured to perform operations comprising:

generating a first corrected clock signal of the pair of corrected clock signals as a first output clock signal through two first inverters;

generating the first corrected clock signal as a second output clock signal through a second inverter;

generating a second corrected clock signal of the pair of corrected clock signals as a third output clock signal through two third inverters; and generating the second corrected clock signal as a fourth output clock signal through a fourth inverter.

14. The memory system according to claim 9, wherein the semiconductor memory device further comprises a preset time tSAC matching delay line circuit that is configured to provide a pair of delayed clock signals generated by delaying the pair of corrected clock signals by a preset time to the first unit delay path circuit.

15. The memory system of claim 14, wherein the second unit delay path circuit is configured to receive the pair of delayed clock signals and generate the plurality of duplicate clock signals.

16. A semiconductor memory device comprising:

a data clock buffer configured to receive a data clock signal from a memory controller and output a pair of differential input signals;

an output path configured to adjust duty ratios of the pair of differential input signals based on a control code to generate a pair of corrected clock signals and generate four output clock signals having different phases based on the pair of corrected clock signals, wherein the output path comprises a first unit delay path circuit configured to receive a pair of delayed clock signals and generate the four output clock signals;

a rising edge multiplexer configured to serially output data that was input in parallel based on a rising edge of each of the four output clock signals; and a feedback path configured to generate four duplicate clock signals having different phases based on the pair of corrected clock signals, detect a duty error from the duplicate clock signals, and output the control code corresponding to the duty error that was detected, wherein the feedback path comprises a second unit delay path circuit configured to generate the four duplicate clock signals based on the pair of corrected clock signals.

17. The semiconductor memory device of claim 16, wherein the output path further comprises:

a quadrature error correction circuit (QEC) configured to adjust duty cycles of the pair of differential input signals according to the control code and output the pair of corrected clock signals; and a preset time tSAC matching delay line circuit configured to generate the pair of delayed clock signals by delaying the pair of corrected clock signals by a preset time.

18. The semiconductor memory device of claim 16, wherein the feedback path further comprises:

a QEC detector configured to detect a rising edge of each of the duplicate clock signals and generate the control code such that a time difference between two duplicate clock signals of which the rising edges are adjacent to each other is uniform.

19. The semiconductor memory device of claim 18, wherein the QEC detector comprises:

a multiplexer configured to select and output two of the four duplicate clock signals according to a control signal;

a phase detector configured to detect phases of the two duplicate clock signals and output a duty error as a skew detection value; and a filter configured to generate the control code based on the skew detection value.

\* \* \* \* \*